US008928615B2

(12) United States Patent
Meng et al.

(10) Patent No.: US 8,928,615 B2
(45) Date of Patent: Jan. 6, 2015

(54) OSCILLOSCOPE WITH TOUCH CONTROL AND TOUCH CONTROL OPERATING METHOD OF DISPLAYING WAVEFORM THEREOF

(71) Applicant: Good Will Instrument Co., Ltd., New Taipei (TW)

(72) Inventors: Chiang-Kai Meng, New Taipei (TW); Yuan-Long Huang, New Taipei (TW)

(73) Assignee: Good Will Instrument Co., Ltd., New Taipei (TW)

( * ) Notice: Subject to any disclaimer, the term of this patent is extended or adjusted under 35 U.S.C. 154(b) by 180 days.

(21) Appl. No.: 13/671,702

(22) Filed: Nov. 8, 2012

(65) Prior Publication Data

US 2014/0125600 A1    May 8, 2014

(51) Int. Cl.
  *G09G 5/00*   (2006.01)
  *G06F 3/01*   (2006.01)
  *G06F 3/0488*  (2013.01)

(52) U.S. Cl.
  CPC .............. *G06F 3/017* (2013.01); *G06F 3/0488* (2013.01)
  USPC ........ 345/173; 345/174; 345/178; 178/18.01; 178/18.06

(58) Field of Classification Search
  USPC ...................... 345/173–178; 178/18.01–18.09
  See application file for complete search history.

(56) References Cited

U.S. PATENT DOCUMENTS

| 8,669,958 B2* | 3/2014 | Hillis et al. ................... 345/173 |
| 2006/0026536 A1* | 2/2006 | Hotelling et al. ............. 715/863 |
| 2007/0109274 A1* | 5/2007 | Reynolds ....................... 345/173 |
| 2013/0328787 A1* | 12/2013 | Stearns et al. ................ 345/173 |

* cited by examiner

*Primary Examiner* — Jennifer Nguyen
(74) *Attorney, Agent, or Firm* — Hershkovitz & Associates, PLLC; Abraham Hershkovitz

(57) ABSTRACT

An oscilloscope with touch control has a touch screen display unit and a waveform processing and sampling unit. The touch screen display unit is connected to the waveform processing and sampling unit and has a touch control module and a display module. The touch control module detects a touch gesture and converts the touch gesture into a set of waveform processing parameters. The waveform processing and sampling unit has at least one signal input port to receive at least one external signal to be tested, processes the signal to be tested into a corresponding waveform image, and outputs the waveform image to the display module. Accordingly, the touch screen display unit enables the operation and display of the waveform thereon and provides more space originally occupied by conventional knobs so that the display module can be enlarged or the oscilloscope can be miniaturized.

11 Claims, 14 Drawing Sheets

OSCILLOSCOPE WITH TOUCH CONTROL AND TOUCH CONTROL OPERATING METHOD OF DISPLAYING WAVEFORM THEREOF

BACKGROUND OF THE INVENTION

1. Field of the Invention

The present invention relates to an oscilloscope and an operating method of displaying waveform thereof, and more particularly to an oscilloscope with touch control and a touch control operating method displaying waveform thereof.

2. Description of the Related Art

Oscilloscopes are one type of testing instruments for measuring electronic signals, are extensively applied in testing and studying characteristic curves of electronic signals and electronic elements, and are one of the most common testing equipment for researches in electronic engineering and electrical engineering.

With reference to FIGS. 11 and 12, a conventional oscilloscope has a control module 50, a waveform processing and sampling unit 60 and a display module 70.

The control module 50 has a processor 51, multiple knobs 52 and multiple buttons 53. The processor 51 is connected to the knobs 52 and the buttons 53 and generates a set of waveform processing parameters according to the operation of the knobs 52 and the buttons 53.

The waveform processing and sampling unit 60 is connected to the processor 51 of the control module 50, has at least one signal input port 61 to receive an external signal to be tested, and processes the signal to be tested to a corresponding waveform according to the set of waveform processing parameters generated by the control module 50.

The display module 70 is connected to the waveform processing and sampling unit 60 to receive and display the waveform.

The set of waveform processing parameters set up by the oscilloscope targets at zooming or shifting the displayed waveform. For example, the set of waveform processing parameters usually includes parameters for vertical position, vertical scale (amplitude gain control), horizontal scale (sampling rate) and trigger position. Increasing or decreasing the parameter for vertical position can shift the displayed waveform up or down along a vertical axis. Decreasing or increasing the parameter for trigger position (pre-trigger or post-trigger) can shift the displayed waveform left or right along a horizontal axis. Increasing or decreasing the parameter for gain control can increase or decrease the displayed waveform-amplitude (changing a vertical scale). Increasing or decreasing the parameter for sampling rate can zoom in or zoom out the displayed waveform along the horizontal axis (changing a horizontal scale). Hence, it is convenient for users to zoom or shift the displayed waveform to observe all details about the waveform.

However, the knobs 52 occupy most of the space of the oscilloscope that is not unoccupied by the display module 70. As each knob 52 is operated clockwise or counter-clockwise, the knob 52 can only adjust one waveform processing parameter. This is why many knobs are required. Because the knobs 52 are much space-taking, the conventional oscilloscope fails to be miniaturized. Meanwhile, the knobs also cause confusion to users in operation and oftentimes result in incorrect operation of the knobs. Moreover, when the knobs 52 are used to adjust the waveform processing parameters, the rate of change associated with the waveform processing parameter depends on how many rotations the knobs 52 are turned. As each knob 52 is normally turned by fingers, limited number of turns of the knob 52 in such manual adjustment is against the display of a rapidly shifted waveform, especially when the displayed waveform is shifted a long distance along the horizontal axis. Users normally need to turn the knobs for tens of rotations before actually viewing the characteristics of the waveform to be observed. Besides, the knobs 52 pertain to mechanical elements not durable enough and need to be repaired and replaced from time to time.

SUMMARY OF THE INVENTION

An objective of the present invention is to provide a knob-free and durable oscilloscope with touch control and a touch control operating method of displaying waveform thereof.

To achieve the foregoing objective, the oscilloscope with touch control has a touch screen display unit and a waveform processing and sampling unit.

The touch screen display unit has a touch control module and a display module.

The touch control module detects a touch gesture and generates a set of waveform processing parameters according to the touch gesture.

The waveform processing and sampling unit is connected to the touch control module and the display module of the touch screen display unit, has at least one signal input port to respectively receive at least one external signal to be tested, selectively processes one of the at least one external signal to be tested to a corresponding waveform image according to the set of waveform processing parameters, and outputs the waveform image to the display module to further display the waveform image on the display module.

The touch screen display unit enables the operation and display of the waveform thereon to eliminate the space required by the knobs in conventional oscilloscopes so as to enlarge the display module or miniaturize the oscilloscope and provide a direct and fast operation for users.

Preferably, the touch control module has a touch panel, a touch controller and a CPU. The touch panel serves to detect at least one moving trajectory of touch point. The touch controller is connected to the touch panel, and outputs at least one set of continuous coordinates corresponding to the at least one moving trajectory of touch point. The CPU is connected to the touch controller, after receiving the at least one set of continuous coordinates from the touch controller, determines a touch gesture according to a variation of the at least one set of continuous coordinates, and generates the set of waveform processing parameters based on the determined touch gesture.

Preferably, when the touch panel of the touch control module detects a single-point drag having a single touch point and a set of continuous coordinates, the set of continuous coordinates of the single-point drag has multiple continuous vertical coordinates and multiple continuous horizontal coordinates of the single touch point, and the CPU sets up the vertical position value according to a variation of the continuous vertical coordinates and sets up the trigger position value according to a variation of the continuous horizontal coordinates.

In contrast to the operation of knob, which only allows clockwise and counterclockwise rotations, the present invention allows users to operate with single-point drag gesture to respectively vary the vertical position value and the trigger position value. The operations of horizontally and vertically moving a displayed waveform can be integrated on a touch panel and the number of knobs can be reduced and confusion caused in operation arising from too many knobs can be avoided.

Preferably, the set of waveform processing parameter further has a gain value and a sampling rate. When the touch panel of the touch control module detects a multi-point drag having two touch points moving oppositely and two sets of continuous coordinates, each set of continuous coordinates has multiple continuous vertical coordinates and multiple continuous horizontal coordinates associated with one of the touch points of the multi-point drag having two touch points moving oppositely. The CPU decreases or increases the gain value according to a variation of the two sets of continuous vertical coordinates of the two touch points approaching or departing from each other and decreases or increases the sampling rate according to a variation of the two sets of continuous horizontal coordinates of the two touch points approaching or departing from each other.

Given the multi-point drag, the gain value and the sampling rate can be further integrated on the same touch panel, thereby facilitating the movement and zooming operation of the displayed waveform and providing operational convenience without causing confusion in operation.

To achieve the foregoing objective, the oscilloscope has a touch screen display unit for detecting a touch gesture and displaying a waveform image, the method is performed after the oscilloscope receives a signal to be tested and has steps of:

receiving a set of waveform processing parameters from the touch screen display unit, wherein the set of waveform processing parameters is generated by the touch screen display unit according to a variation of the detected touch gesture;

processing a signal to be tested to a corresponding waveform image according to the set of waveform processing parameters; and outputting the waveform image to the touch screen display unit and displaying the waveform image on the touch screen display unit.

Preferably, the step of generating the set of waveform processing parameters has steps of:

if detecting the single-point drag, setting up the vertical position value according to a variation of multiple continuous vertical coordinates of the single touch point of the single-point drag and setting up the trigger position value according to a variation of multiple continuous horizontal coordinates of the single touch point of the single-point drag; and if detecting the multi-point drag, decreasing or increasing the gain value according to a variation of multiple continuous vertical coordinates of the two touch points approaching or departing from each other and decreasing or increasing the sampling rate according to a variation of multiple continuous horizontal coordinates of the two touch points approaching or departing from each other.

Other objectives, advantages and novel features of the invention will become more apparent from the following detailed description when taken in conjunction with the accompanying drawings.

DETAILED DESCRIPTION OF THE INVENTION

Figure 1A:
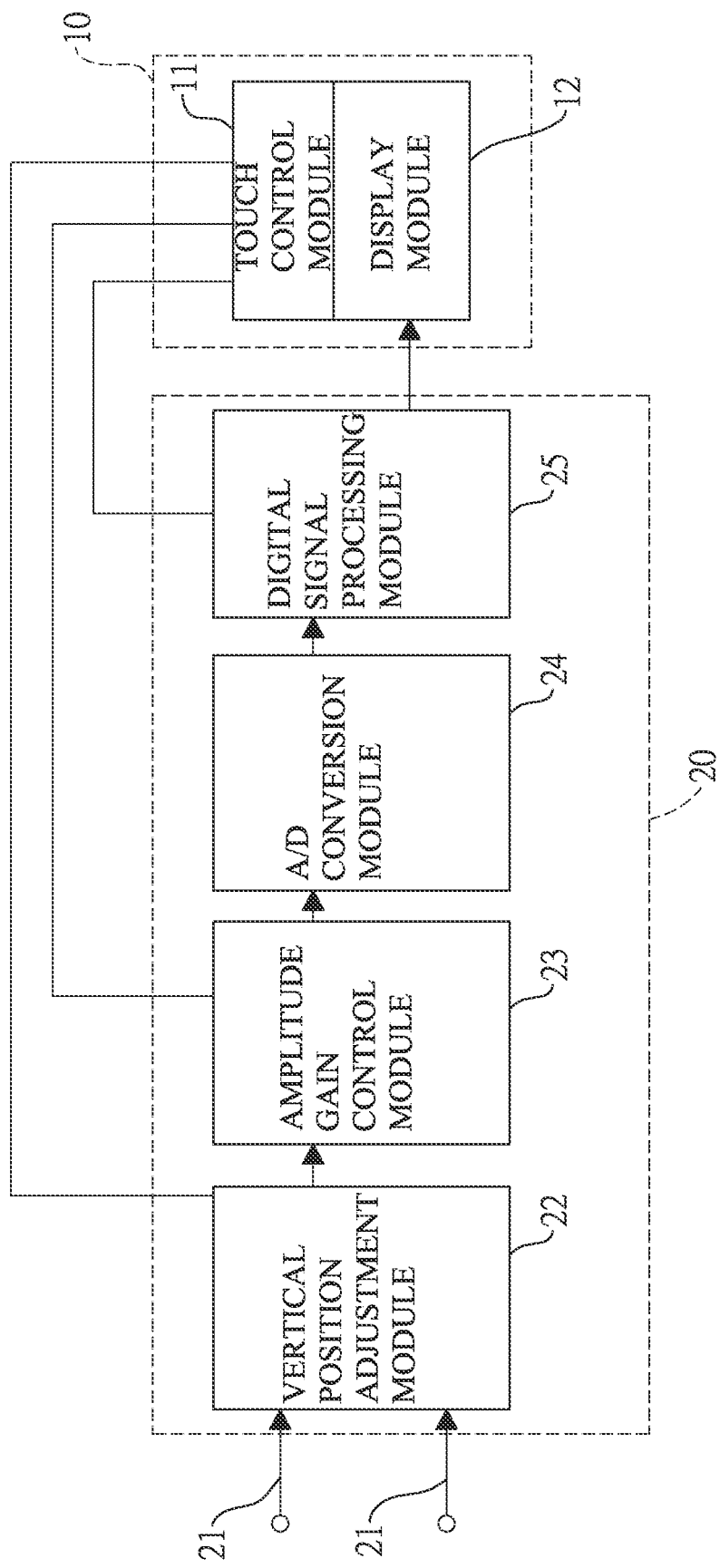
FIG. 1A is a functional block diagram of an oscilloscope with touch control in accordance with the present invention.

With reference to FIG. 1, an oscilloscope with touch control in accordance with the present invention has a touch screen display unit 10 and a waveform processing and sampling unit 20.

The touch screen display unit 10 has a touch control module 11 and a display module 12. The touch control module 11 detects a touch gesture and generates a set of waveform processing parameters according to the touch gesture. The details regarding how to convert a touch gesture into a corresponding set of waveform processing parameters are described later.

The waveform processing and sampling unit 20 is connected to the touch control module 11 and the display module 12 of the touch screen display unit 10, has at least one signal input port 21 to receive at least one external signal to be tested, selectively samples and then digitizes one of the at least one external signal to be tested and processes the digitized external signal to be tested to a corresponding waveform image according to the set of waveform processing parameters, and outputs the waveform image to the display module 12 to further display the waveform image on the display module 12. In the present embodiment, the waveform processing and sampling unit 20 has a vertical position adjustment module 22, an amplitude gain control module 23, an analog-to-digital (A/D) conversion module 24 and a digital signal processing module 25. The vertical position adjustment module 22 is connected to the signal input port 21.

Figure 1B:
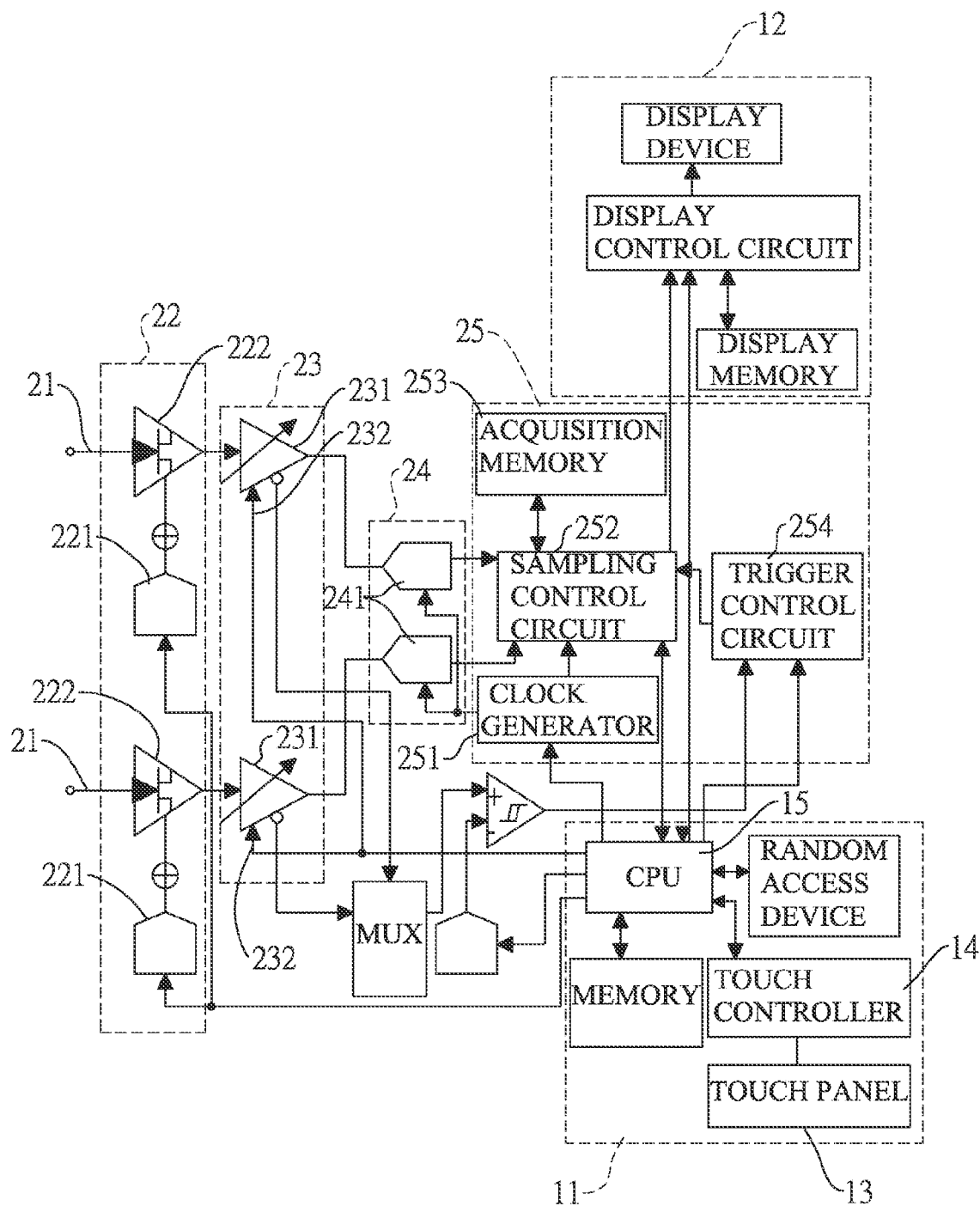
FIG. 1B is a circuit diagram of the oscilloscope in FIG. 1A.

With reference to FIG. 1B, given the oscilloscope with two signal input ports 21 as an example, the touch control module 11 has a touch panel 13, a touch controller 14 and a CPU 15. The touch panel 13 serves to detect at least one moving trajectory of touch point associated with the touch gesture when touched by a user. The touch controller 14 is connected to the touch panel 13 and the CPU 15, and outputs at least one set of continuous coordinates corresponding to the at least one moving trajectory of touch point. After receiving the at least one set of continuous coordinates, the CPU 15 determines a touch gesture according to a variation of the at least one set of continuous coordinates, and generates a corresponding set of waveform processing parameters based on the determined touch gesture. The set of waveform processing parameters has a vertical position value, a gain value, a sampling rate and a trigger position value.

The touch panel 13 of the touch control module 11 detects a single-point drag and a multi-point drag.

When the touch panel 13 detects a single-point drag, the single-point drag has a single touch point and a set of continuous coordinates. The touch controller 14 outputs the set of continuous coordinates containing multiple vertical coordinates and multiple horizontal coordinates of a moving trajectory of the single touch point. The CPU 15 increases or decreases the vertical position values when detecting that the vertical coordinates of the moving trajectory of the single-point drag increases or decreases, and increases or decreases the trigger position values when detecting that the horizontal coordinates of the moving trajectory of the single touch point increases or decreases.

When the touch panel 13 detects a multi-point drag, the multi-point drag can be defined by two touch points and two sets of continuous coordinates of two moving trajectories of the two touch points. Each set of continuous coordinates of the multi-point drag has multiple continuous vertical coordinates and multiple continuous horizontal coordinates. The touch controller 14 outputs the two sets of continuous coordinates of the two moving trajectories of the two touch points. After receiving the two sets of continuous coordinates, the CPU 15 decreases or increases the vertical scale (gain value) by determining if the continuous vertical coordinates of the two moving trajectories of the two touch points approach or depart from each other, and decreases or increases the horizontal scale (sampling rate) by determining if the continuous horizontal coordinates of the two moving trajectories of the two touch points approach or depart from each other. In the present embodiment, the CPU has an activation threshold built therein, multiple zoom levels corresponding to different gain value and multiple frequency levels corresponding to different sampling rate, decreases or increases the gain value to map to a corresponding vertical scale when the continuous vertical coordinates of the two moving trajectories of the two touch points approach or depart from each other and a sum of two respective displacements of the two touch points is greater than the activation threshold, and decreases or increases the sampling rates to map to a corresponding horizontal scale when the continuous horizontal coordinates of the two moving trajectories of the two touch points approach or depart from each other and a sum of two respective displacements of the two touch points is greater than the activation threshold.

The adjustments associated with vertical position, vertical scale, horizontal scale and horizontal trigger position are described as follows.

1. Adjustment of Vertical Position

Figure 2A:
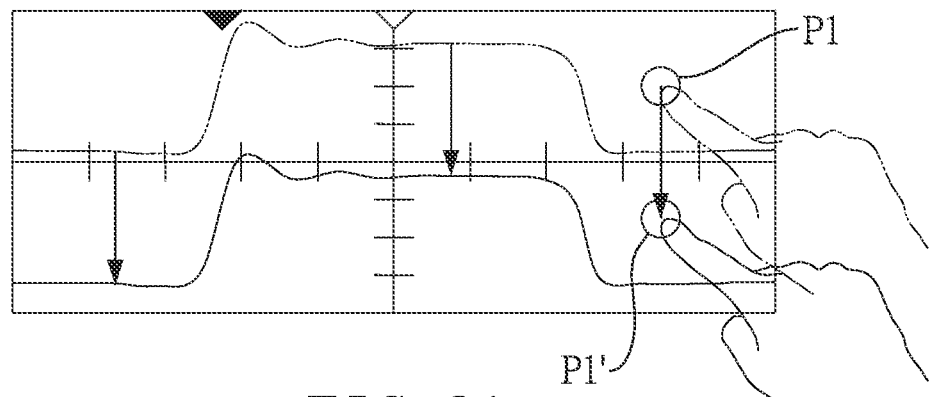
FIG. 2A is an operational schematic view illustrating to set up a parameter for vertical position with a single-point drag in accordance with the present invention.
Figure 2B:
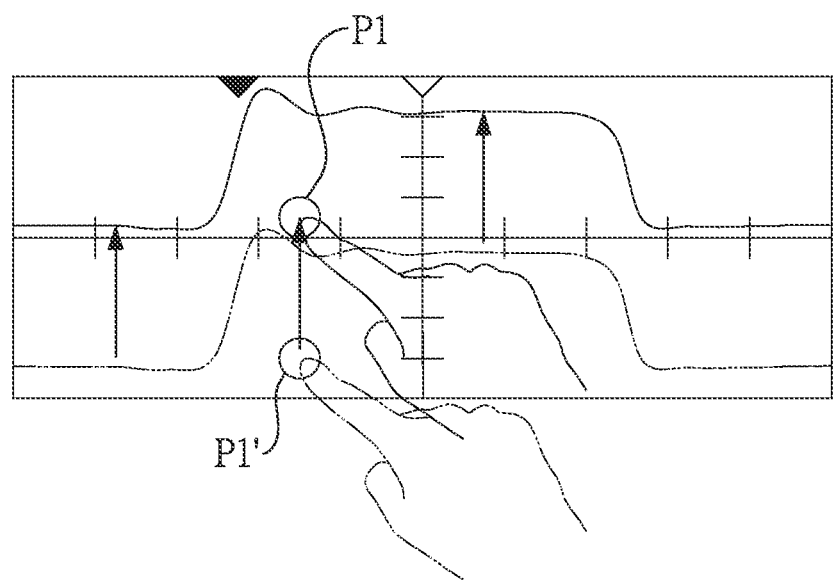
FIG. 2B is another operational schematic view illustrating to set up a parameter for vertical position with a single-point drag in accordance with the present invention.

With reference to FIGS. 1B, 2A and 2B, the vertical position adjustment module 22 has two digital-to-analog (D/A) converters 221 and two voltage adders 222. The two D/A converters 221 are respectively connected to the voltage adders 222 and are connected to the CPU 15 of the touch control module 11. The CPU 15 outputs a vertical position value to each of the two D/A converters 221. After receiving the vertical position value, each D/A converter 221 outputs a corresponding DC voltage to one of the voltage adders 222. Each voltage adder 222 is connected to one of the signal input ports 21 to add the DC voltage outputted from a corresponding D/A converter 221 to a corresponding signal to be tested. Hence, when a touch point P1 moves downwards, the continuous vertical coordinates of a moving trajectory of the touch point P1 tend to decrease. The DC voltage added to the signal to be tested through the voltage adder 222 tends to decrease, and the displayed waveform corresponding to the signal to be tested moves downwards along the vertical axis. On the other hand, when the touch point P1 moves upwards, the continuous vertical coordinates of a moving trajectory of the touch point P1 tend to increase. The DC voltage added to the signal to be tested through the voltage adder 222 tends to increase, and the displayed waveform corresponding to the signal to be tested moves upwards along the vertical axis.

2. Adjustment of Vertical Scale

Figure 3A:
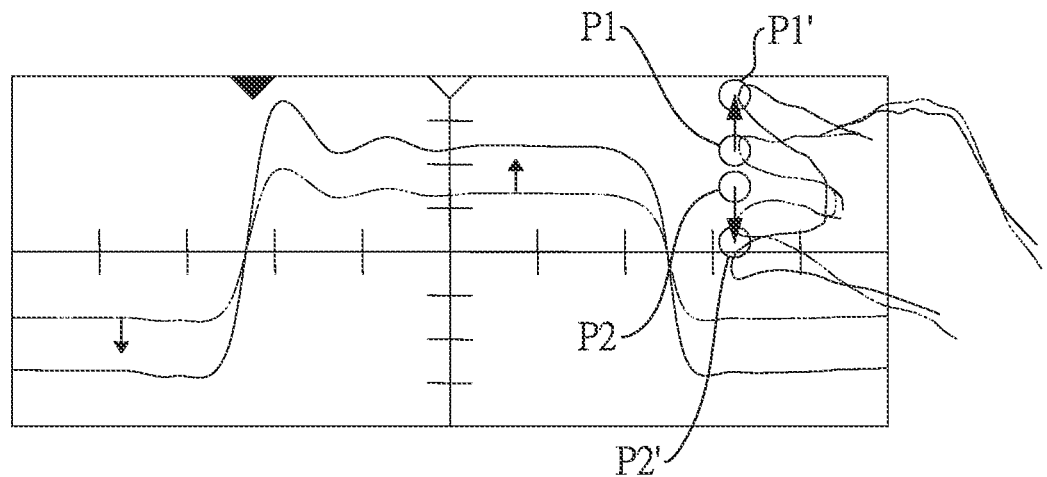
FIG. 3A is an operational schematic view illustrating to set up a parameter for vertical scale with a multi-point drag with two touch points moving oppositely in accordance with the present invention.
Figure 3B:
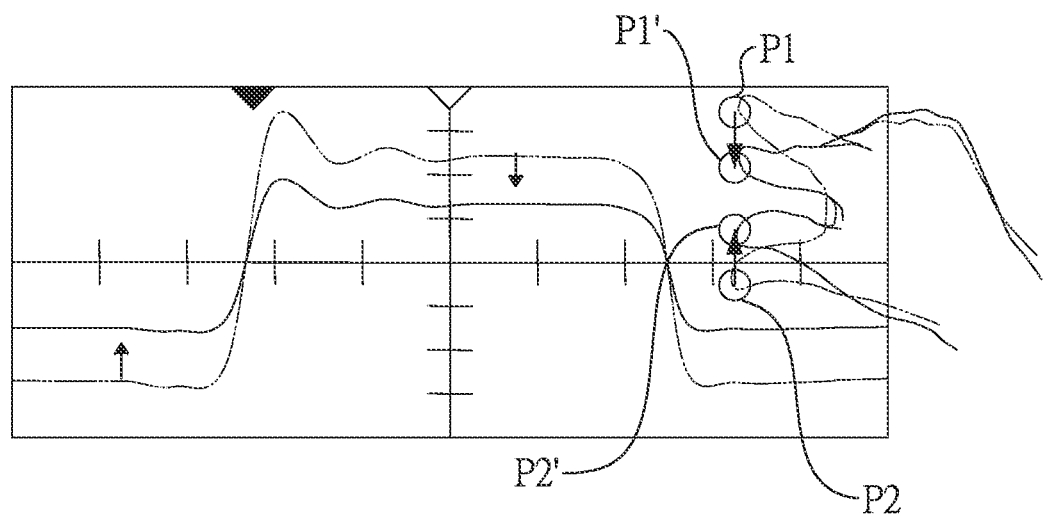
FIG. 3B is another operational schematic view illustrating to set up a parameter for vertical scale with a multi-point drag with two touch points moving oppositely in accordance with the present invention.

With reference to FIGS. 1B, 3A and 3B, the amplitude gain control module 23 has two amplifiers 231. The two amplifiers 231 are connected to the respective voltage adders 222 to receive the signals to be tested outputted from the corresponding voltage adders 222. Each amplifier 231 has a gain control terminal 232 connected to the CPU 15 of the touch control module 11 so that the amplifier 231 can amplify the signal to be tested according to the zoom levels mapped to by the respective gain value. When the continuous vertical coordinates of two touch points P1, P2 touched by two fingers depart from each other and a sum of two respective vertical displacements of the two touch points P1, P2 (i.e. $|\overline{P1P1'}|+|\overline{P2P2'}|$) is greater than the activation threshold, the CPU 15 sets up one of the zoom levels by one level up (for example from 2V/div to 1V/div) so that a scale of the displayed waveform is expanded by one zoom level up along the vertical axis. On the other hand, when the continuous vertical coordinates of two touch points P1, P2 touched by two fingers approach each other and a sum of two respective vertical displacements of the two touch points P1, P2 (i.e. $|\overline{P1P1'}|+|\overline{P2P2'}|$) is greater than the activation threshold, the CPU 15 sets up one of the zoom levels by one level down (for example from 1V/div to 2V/div) so that the scale of the displayed waveform is decreased with one zoom level down along the vertical axis.

3. Adjustment of Horizontal Scale

Figure 4A:
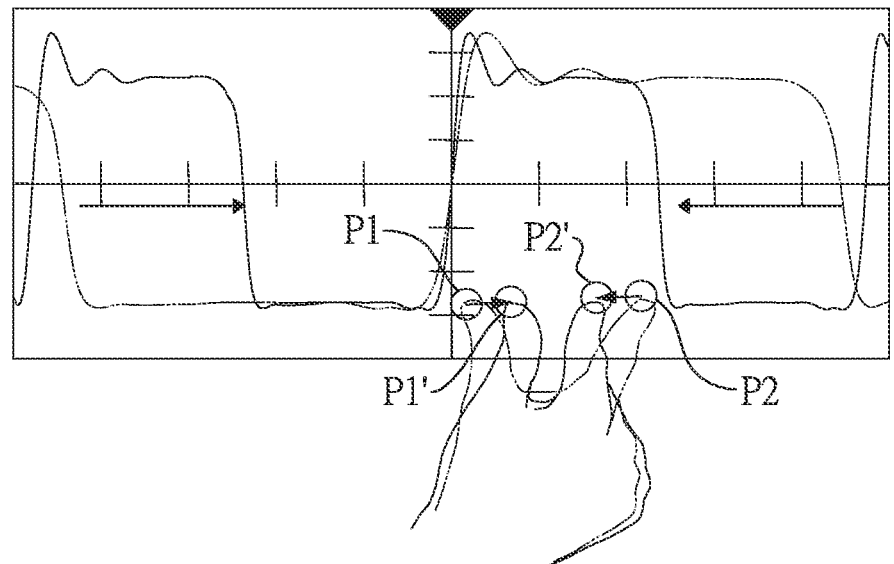
FIG. 4A is an operational schematic view illustrating to set up a parameter for horizontal scale (sampling rate) with a multi-point drag with two touch points moving oppositely in accordance with the present invention.
Figure 4B:
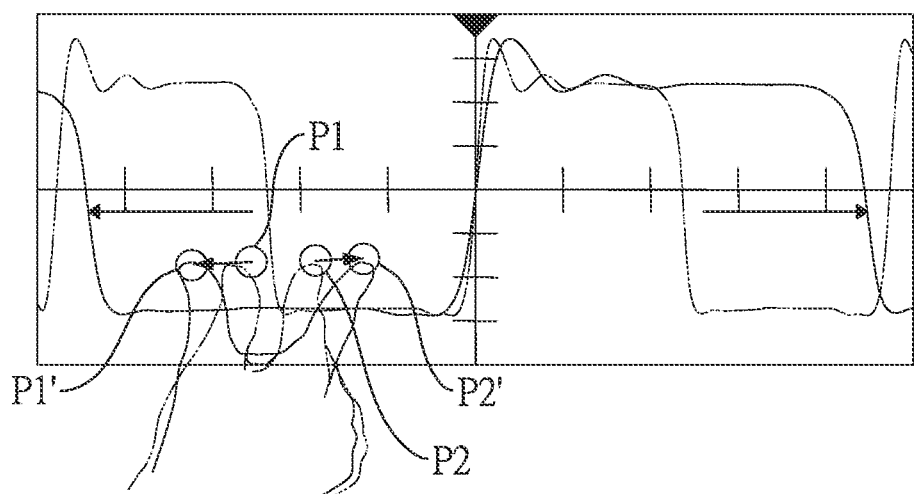
FIG. 4B is another operational schematic view illustrating to set up a parameter for horizontal scale (sampling rate) with a multi-point drag with two touch points moving oppositely in accordance with the present invention.
Figure 5A:
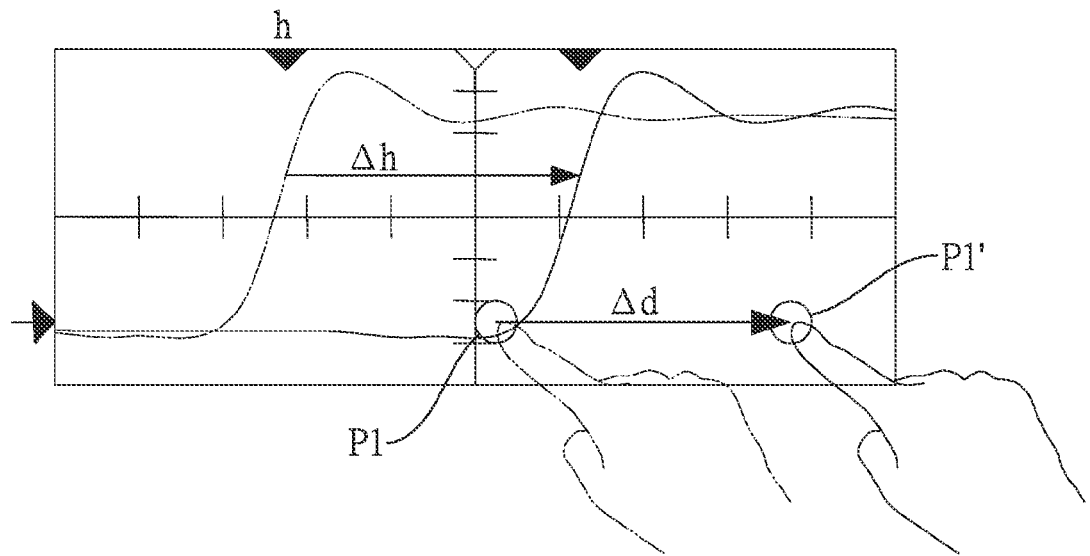
FIG. 5A is an operational schematic view illustrating to set up a parameter for trigger position with a single-point drag in accordance with the present invention.
Figure 5B:
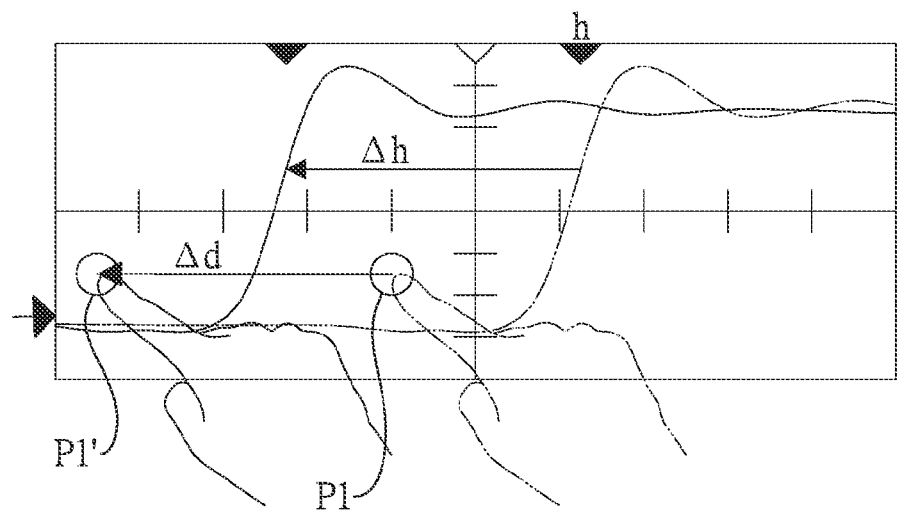
FIG. 5B is another operational schematic view illustrating to set up a parameter for trigger position with a single-point drag in accordance with the present invention.
Figure 5C:
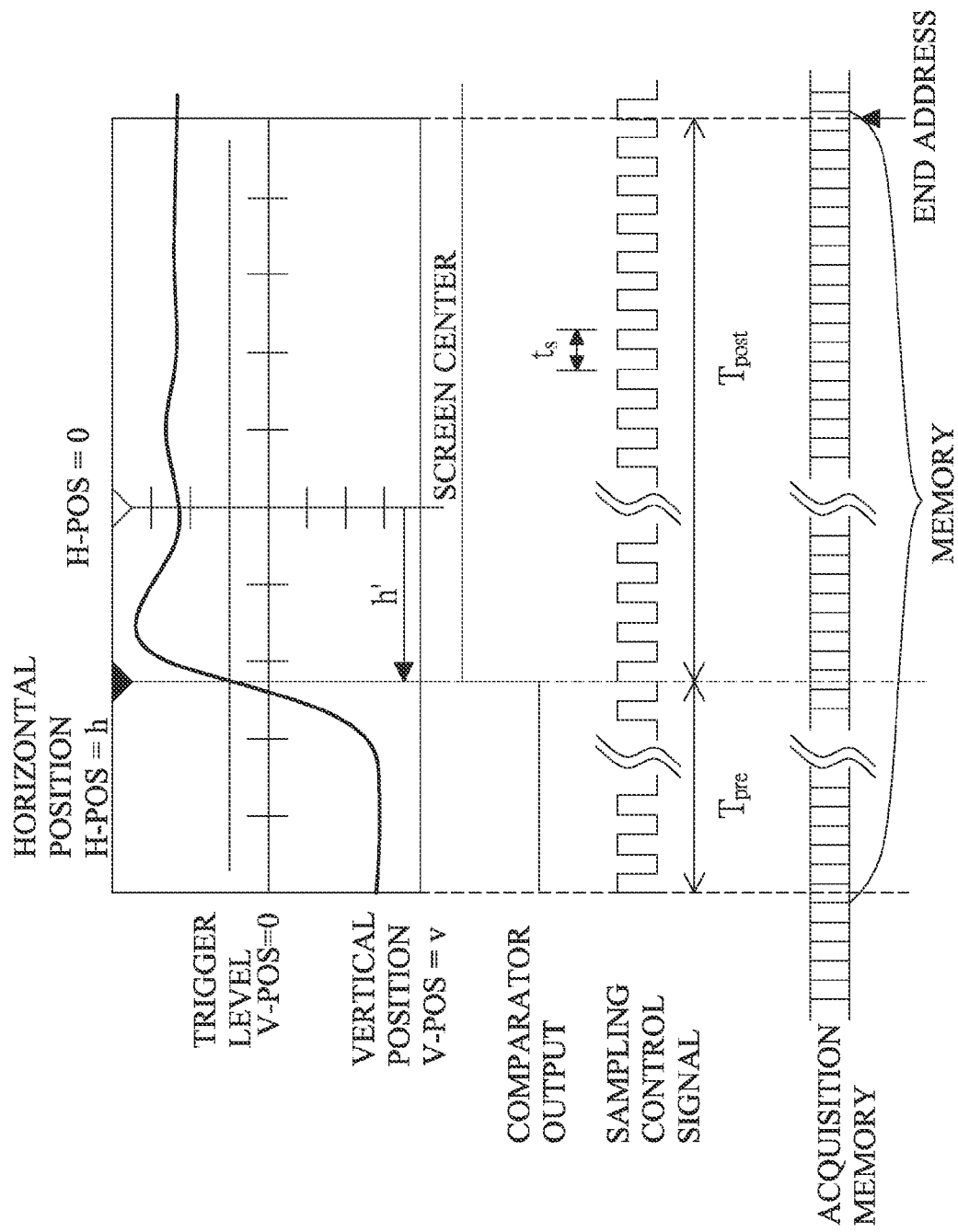
FIG. 5C is a schematic view illustrating a trigger position, a pre-trigger count, a post-trigger count and a data length associated with a displayed waveform in accordance with the present invention.

With reference to FIGS. 1B, 4A and 4B, the A/D conversion module 24 has two A/D converters 241 respectively connected to the two amplifiers 231 of the amplitude gain control module 23 so as to receive the signal to be tested through the signal addition and amplification and to acquire digital data through the sampling and quantization of the signal to be tested.

The digital signal processing module 25 has a clock generator 251, a sampling control circuit 252, an acquisition memory 253 and a trigger control circuit 254. The clock generator 251 is connected to the two A/D converters 241 of the A/D conversion module 24, the sampling control circuit 252 and the CPU 15 of the touch control module 11, and outputs a clock signal with a frequency corresponding to the frequency level set up by the CPU to the two A/D converters 241 and the sampling control circuit 252. The sampling control circuit 252 is connected to the acquisition memory 253, the trigger control circuit 254 and the display module 12, and stores the digital data quantized by and outputted from the two A/D converters 241 according to the clock signal (i.e. the sampling frequency of the A/D converters 241) outputted by the clock generator 251 in the acquisition memory 253. The trigger control circuit 254 outputs a trigger signal to the sampling control circuit 252 so that the sampling control circuit 252 stops sampling after receiving the trigger signal and counting a wait time, reads the digital data with a fixed memory length, takes the digital data as waveform data, and outputs the waveform data to the display module 12 for the display module 12 to display a corresponding waveform. Thus, when the continuous horizontal coordinates of the two touch points P1, P2 approach each other and a sum of two respective horizontal displacements of the two touch points P1, P2 (i.e. $|\overline{P1P1'}|+|\overline{P2P2'}|$) is greater than the activation threshold, the CPU 15 sets up one of the frequency levels by one level down so that the sampling rate is decreased and a time gap between each two sampling points of the corresponding waveform along the horizontal axis increases (for example from 200 ns/div to 500 ns/div). The horizontal scale is changed to a scale with a lower sampling rate, and the waveform displayed on the display module 12 along the horizontal axis is scaled down by one level. On the other hand, when the continuous horizontal coordinates of the two touch points P1, P2 depart from each other and a sum of two respective displacements of the two touch points P1, P2 (i.e. $|\overline{P1P1'}|+|\overline{P2P2'}|$) is greater than the activation threshold, the CPU 15 sets up one of the frequency levels by one level up so that the sampling rate is increased and a time gap between each two sampling points of the corresponding waveform along the horizontal axis decreases (for example from 500 ns/div to 200 ns/div). The horizontal scale is changed to a scale with a higher sampling rate, and the waveform displayed on the display module 12 along the horizontal axis is scaled up by one level.

4. Adjustment of Horizontal Position

As mentioned, the sampling control circuit 252 is suspended after a wait time and then outputs the waveform data after receiving the trigger signal outputted from the trigger control circuit 254. With reference to FIGS. 1B, 5A, 5B and 5C, specifically, the sampling control circuit 252 sets up a pre-trigger count (Tpre) and a post-trigger count (Tpost) therein. The Tpre and Tpost are calculated from a horizontal position h' set up by the CPU 15 of the touch control module 11 according to the following equations.

$$T_{pre}=(H \times N/2-h'),\ h'=h+\Delta h,\ \Delta h=(\Delta d \times N \times H)/I$$

$$T_{post}=(H \times N/2+h'),\ h'=h+\Delta h,\ \Delta h=(\Delta d \times N \times H)/I$$

where N is a number of horizontal divisions displayed on the display module 12 along the horizontal (time) axis (for example, 10 divisions in FIG. 5C), H is a horizontal length (time) per division (unit: s/div), h is a previous coordinate of a trigger point on the horizontal (time) axis (unit: s), Δh is a distance (time) of the trigger point moving along the horizontal (time) axis in current operation (unit: s), Δd is a pixel count of the single-touch point moving horizontally in current operation, and I is a total pixel count of the display module 12 in the horizontal direction.

After counting the Tpre, the sampling control circuit 252 starts to receive the trigger signal outputted from the trigger control circuit 254, waits for a time specified by the Tpost after receiving the trigger signal, and then stop sampling, reads the digital data with the fixed memory length from the acquisition memory 253, processes the digital data to a waveform image, and outputs the waveform image to the display module 12. Hence, when the single touch point P1 is moving rightward, the continuous horizontal coordinates of the touch point tend to increase, the Tpre tends to increase and the Tpost tends to decrease, the continuous horizontal coordinates of the touch point are moving rightward, and the waveform displayed on the display module 12 is also moving rightward. On the other hand, with further reference to FIG. 5C, when the touch point P1 is moving leftward, the continuous horizontal coordinates of the touch point tend to decrease, the Tpre tends to decrease and the Tpost tends to increase, the continuous horizontal coordinates of the touch point are moving leftward, and the waveform displayed on the display module 12 is also moving leftward.

The foregoing adjustments of vertical movement, gain value, sampling rate and horizontal movement respectively correspond to the settings of the waveform processing parameters associated with vertical position value, vertical scale, horizontal scale and trigger position value.

Five more advanced operations are further described as follows.

1. Adjustment of Slanted Movement

Figure 6:
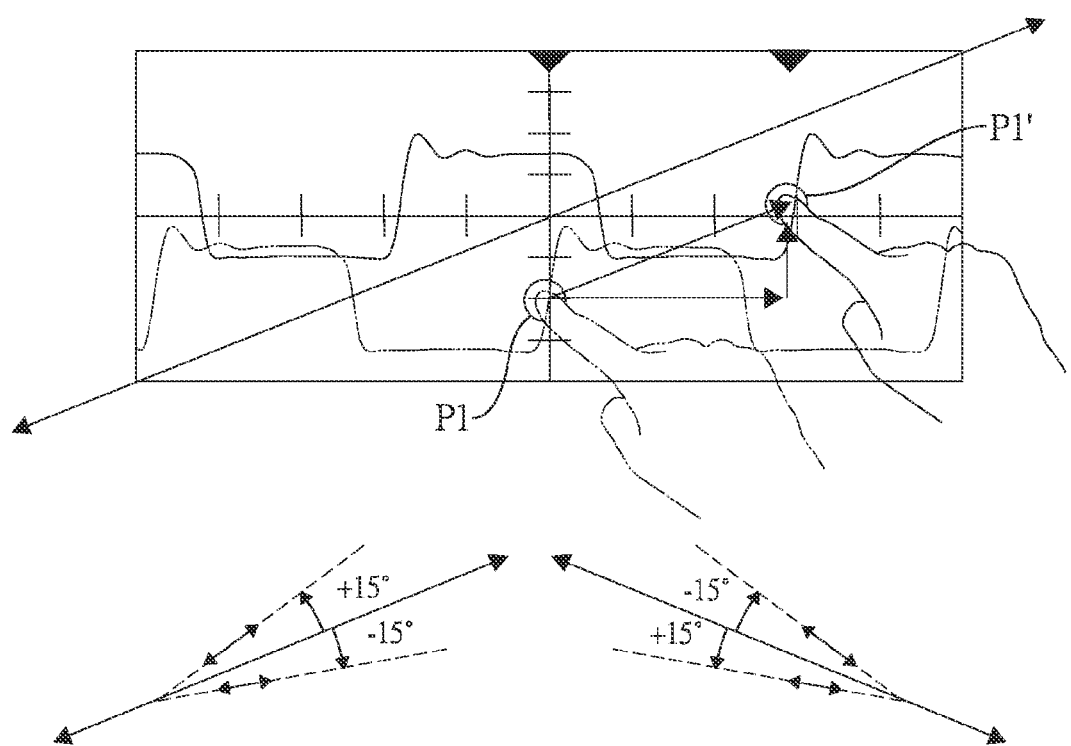
FIG. 6 is an operational schematic view illustrating to set up parameters for vertical position and trigger position with a single-point drag in accordance with the present invention.

With reference to FIG. 6, when the touch panel detects a single-point drag, the continuous coordinates of a moving trajectory of a single touch point may vary both horizontally and vertically. When receiving the continuous coordinates of the single touch point, the CPU 15 determines if a slanted angle between a moving direction of the single touch point and the horizontal axis falls within a range of 30° to 60° (or 120° to 150°), if negative, the CPU 15 neglects the coordinates with smaller changes along one of the horizontal and vertical directions, and if positive, the CPU 15 varies the vertical position value according to the variation of the continuous coordinates along the vertical direction and varies the trigger position value according to the variation of the continuous coordinates along the horizontal direction. By limiting the foregoing single-point drag aligning within the range of 30° to 60° (or 120° to 150°), the displayed waveform can be simultaneously moving horizontally and vertically and false operation arising from the slanted angle being too small can be avoided.

2. Diagonal Adjustment

Figure 7:
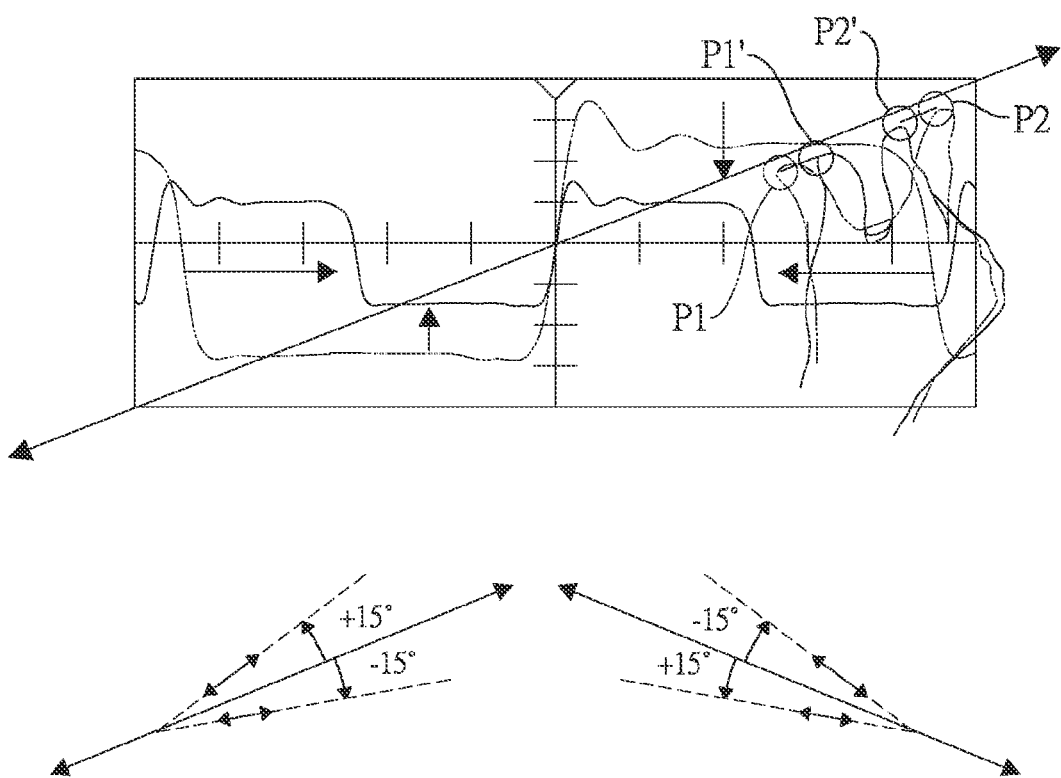
FIG. 7 is an operational schematic view illustrating to set up parameters for vertical scale and horizontal scale (sampling rate) with a multi-point drag with two touch points moving oppositely in accordance with the present invention.

With reference to FIG. 7, when the touch panel 13 detects a multi-point drag, two sets of continuous coordinates of two touch points may approach or depart from each other both horizontally and vertically. When receiving the continuous coordinates of the two touch points, the CPU 15 determines if a slanted angle between a direction of the two touch points approaching or departing from each other and the horizontal axis falls within a range of 30° to 60° (or 120° to 150°), if negative, the CPU 15 neglects the coordinates with smaller changes approaching or departing from each other along one of the horizontal and vertical directions, and if positive, the CPU 15 varies the gain value according to the variation of the continuous coordinates approaching or departing from each other along the vertical direction and varies the sampling rates according to the variation of the continuous coordinates approaching or departing from each other along the horizontal direction. By limiting the foregoing multi-point drag aligning within the range of 30° to 60° (or 120° to 150°), the displayed waveform can be simultaneously expanded or compressed horizontally and vertically and false operation arising from the slanted angle being too small can be avoided.

3. Adjustment of Fast Movement

Figure 8A:
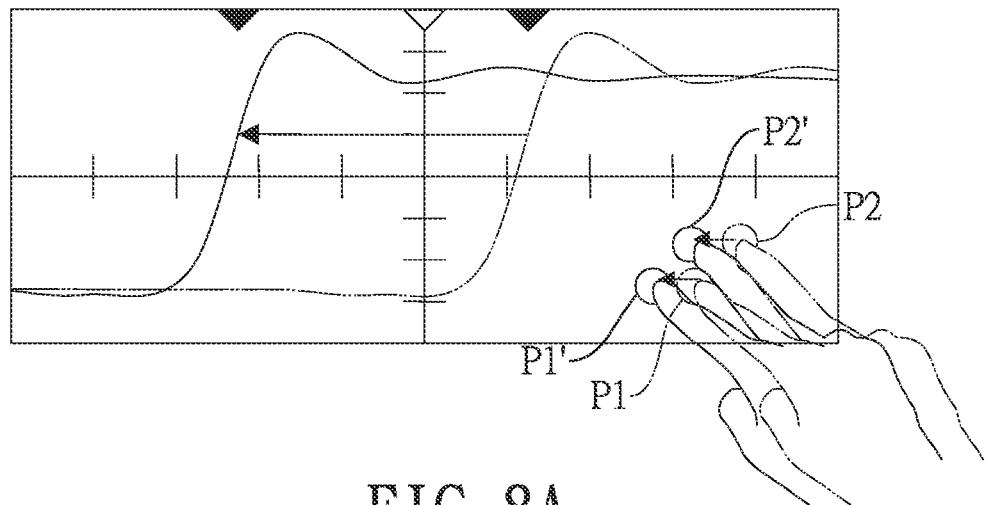
FIG. 8A is an operational schematic view illustrating to rapidly increase or decrease a parameter for trigger position based on a multi-point drag with multiple touch points moving uni-directionally in accordance with the present invention.
Figure 8B:
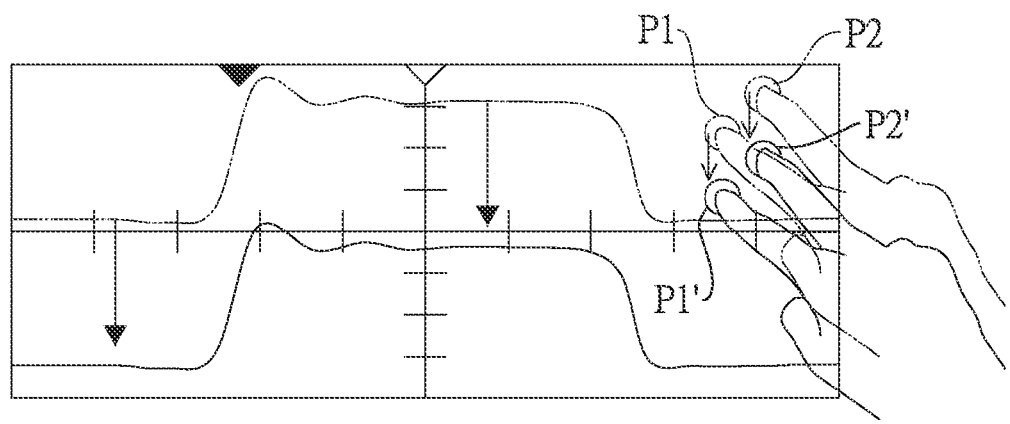
FIG. 8B is an operational schematic view illustrating to rapidly increase or decrease a parameter for vertical position based on a multi-point drag with multiple touch points moving uni-directionally in accordance with the present invention.

With reference to FIGS. 8A and 8B, the touch panel 13 detects a multi-point drag, the multi-point drag is defined by multiple touch points moving uni-directionally and multiple sets of continuous coordinates of multiple moving trajectories of the touch points, and each set of continuous coordinates has multiple continuous vertical coordinates and multiple continuous horizontal coordinates. When determining that the touch points are dragged together along the vertical axis, the CPU 15 multiplies the vertical position value by a magnification factor, such as 10, when two touch points are dragged together, or 100 when three touch points are dragged together. When determining that the touch points are dragged together along the horizontal axis, the CPU 15 multiplies the trigger position value by a magnification factor, such as 10, when two touch points are dragged together, or 100 when three touch points are dragged together, or 1000 when four touch points are dragged together. The multiplication of the trigger position value is given by the following equation.

$$\Delta h = n \times (\Delta d \times N \times H)/I (n=1,10,100,1000)$$

Given the foregoing adjustment of fast movement, users can use two or more fingers to accelerate the moving speed horizontally and vertically, thereby quickly locating a desired portion of a waveform to be observed.

4. Adjustment of Slow Movement

Figure 9A:
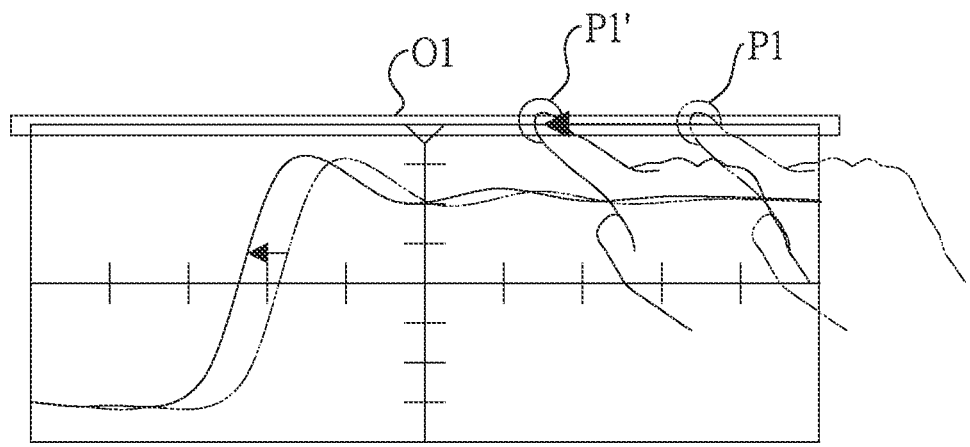
FIG. 9A is an operational schematic view illustrating to slowly increase or decrease a parameter for trigger position with a single-point drag in accordance with the present invention.
Figure 9B:
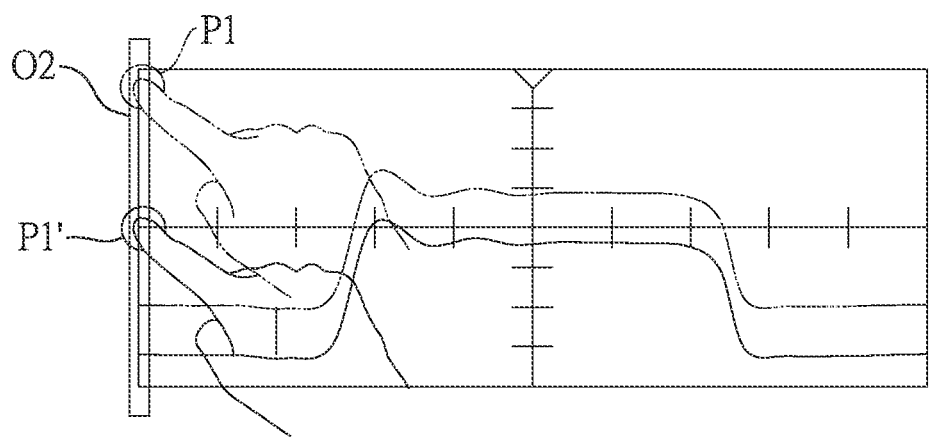
FIG. 9B is an operational schematic view illustrating to slowly increase or decrease a parameter for vertical position with a single-point slow drag in accordance with the present invention.

With reference to FIGS. 9A and 9B, the CPU 15 is connected to the display module 12, sets up a vertical operation zone for slow movement O1 and a horizontal operation zone for slow movement O2 on the display module 12, multiplies the vertical position value by a minification factor, such as $\frac{1}{10} \sim \frac{1}{2}$, when determining that the moving trajectory of a single touch point of a single-point slow drag is located on the vertical operation zone for slow movement O1, and multiplies the trigger position value by a minification factor, such as $\frac{1}{10} \sim \frac{1}{2}$, when determining that the moving trajectory of the touch point of the single-point slow drag is located on the horizontal operation zone for slow movement O2. The multiplication of the trigger position value is given by the following equation.

$$\Delta h = (\Delta d \times N \times H)/(k \times I) \text{ (preferably, } k=2 \sim 10)$$

Given the foregoing adjustment of slow movement, the moving speed of the displayed waveform can be slowed down so that the waveform can be moving to a particular location and the issue of failing to accurately position the waveform when fingers slightly tremble upon slow dragging can be avoided.

5. Adjustment of Inertia Motion

Figure 10:
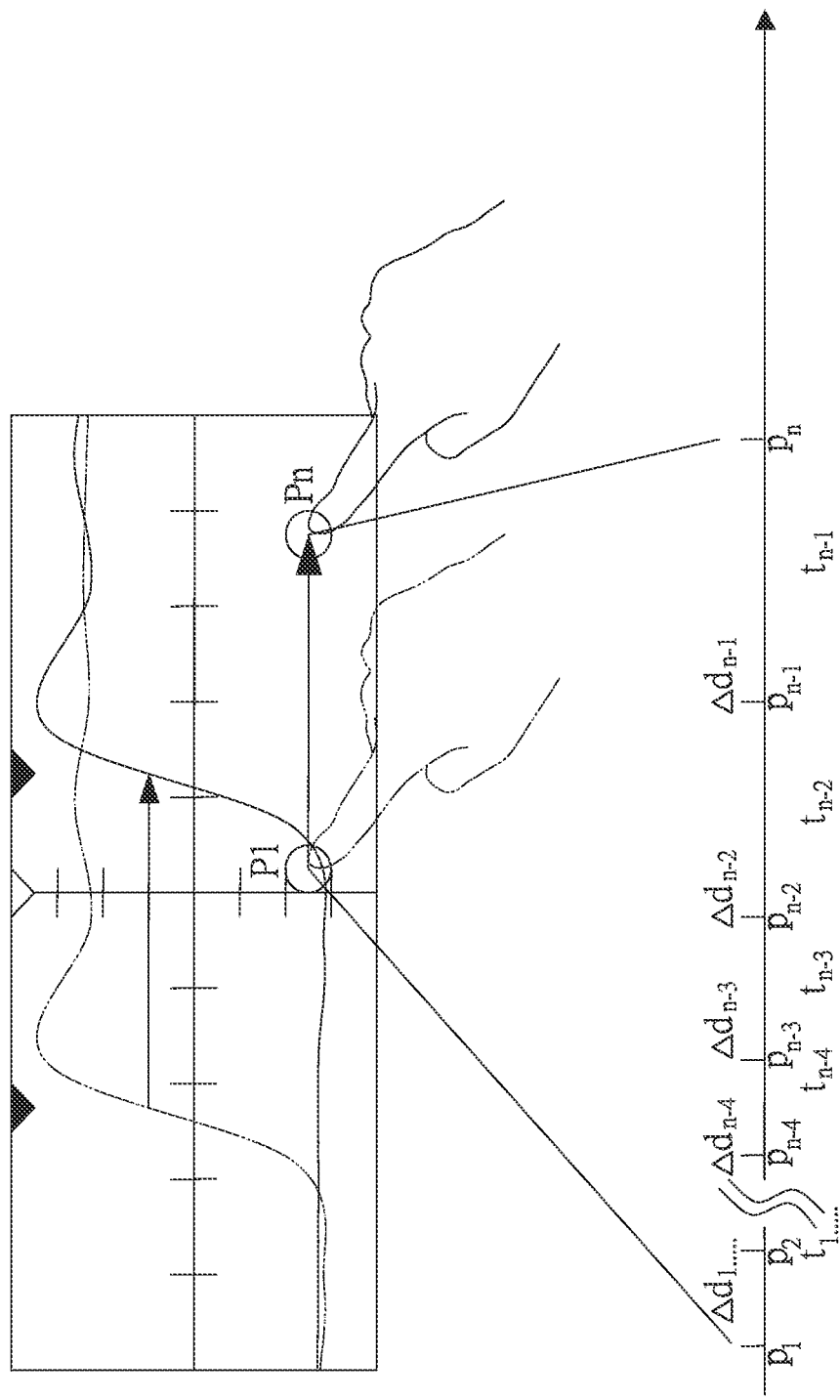
FIG. 10 is an operational schematic view illustrating to set up a parameter for trigger position with a single-point fast drag and throw in accordance with the present invention.
Figure 11:
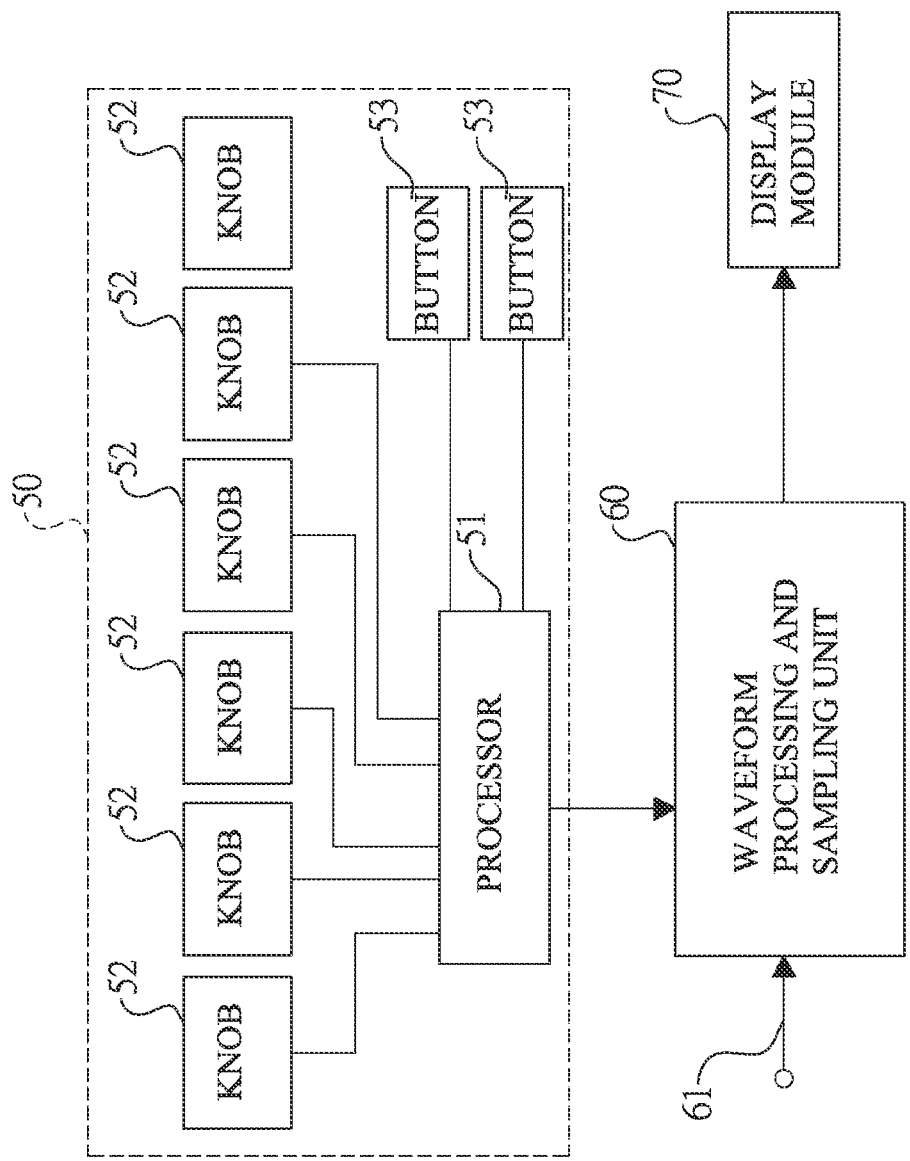
FIG. 11 is a functional block diagram of a conventional oscilloscope.
Figure 12:
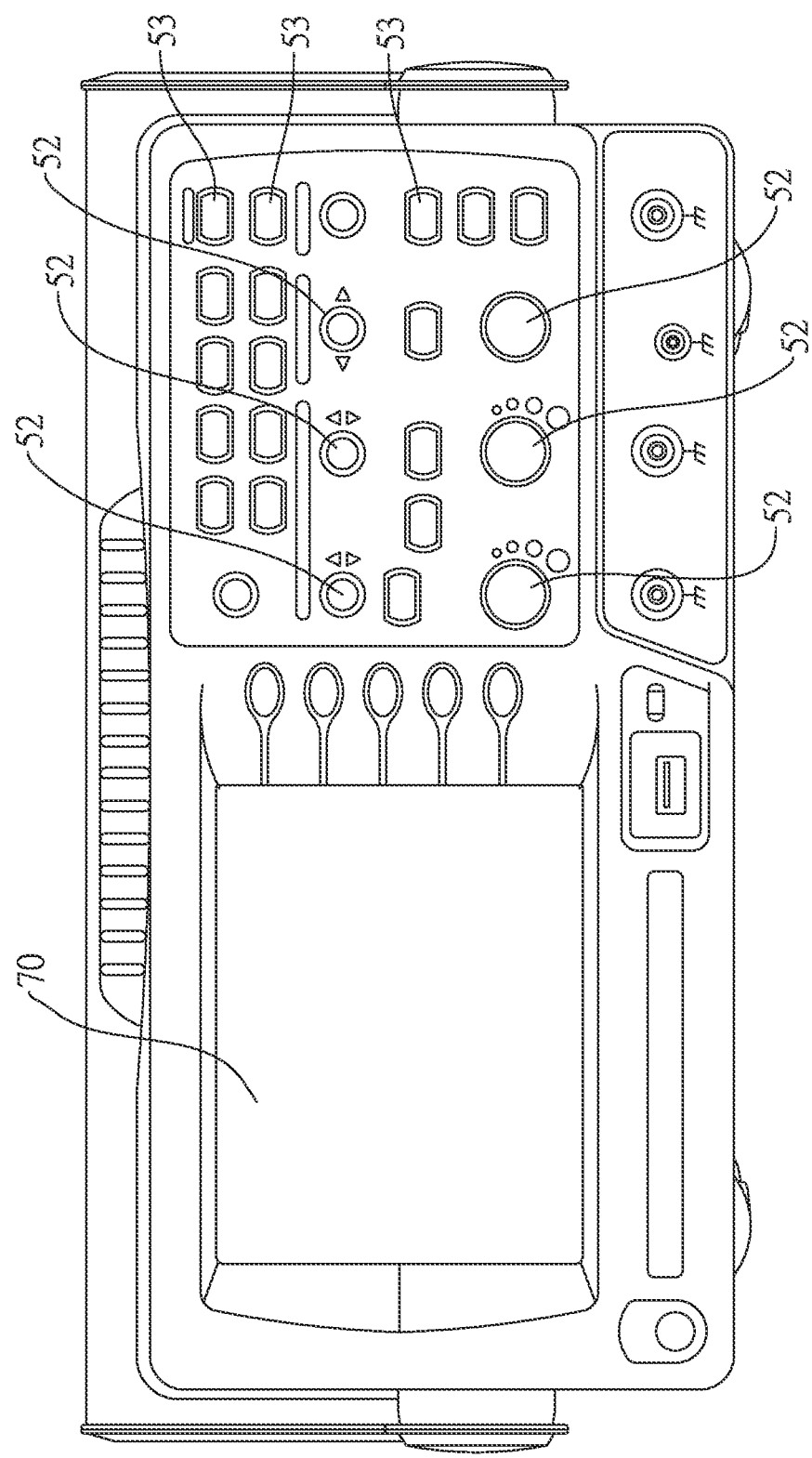
FIG. 12 is a schematic front view of the conventional oscilloscope in FIG. 11.

With reference to FIG. 10, when a single-point fast drag and throw is detected and the touch point is moving according to an inertia motion, the continuous coordinates of the moving trajectory (P1~Pn) gradually increase and a distance between Pn and Pn−1 is the largest. The CPU 15 has a preset deceleration value, defines the distance between the final two coordinates as a largest movement value dM when determining that the distance of adjacent two of the set of continuous coordinates progressively increases, constantly varies the trigger position value using the largest movement value dM, progressively decreases the largest movement value dM with the deceleration value, and stops varying the trigger position value when the largest movement value dM is reduced to 0 (or less than 0).

In sum, the present invention employs the touch screen display unit for users to adjust the waveform processing parameters for displaying a desired waveform. Mechanical knobs are removed to obtain more space originally occupied by those modules other than the display module so that the display module can be enlarged or the entire oscilloscope can be miniaturized. Operation using touch gestures is more diversified and convenient than those using mechanical knobs. The adjustment operation of the four waveform processing parameters can be jointly operated on a single touch panel for users to directly touch the waveform and adjust the waveform processing parameters. Accordingly, a more direct and fast operation of oscilloscope can be provided. The present invention further provides operation of fast movement and inertia motion for users to quickly view a desired portion of a waveform to be observed, and also provides an operation zone for slow movement for users to accurately move and position a particular position on the displayed waveform. In contrast to the operation of mechanical knobs in a conventional oscilloscope, the present invention significantly improve the operation convenience for oscilloscopes.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. An oscilloscope with touch control comprising:
   a touch screen display unit having:
      a touch control module detecting a touch gesture and generating a set of waveform processing parameters according to the touch gesture, wherein the set of waveform processing parameter has a vertical position value, a trigger position value, a gain value and a sampling rate, and the touch control module having:
         a touch panel serving to detect at least one moving trajectory of touch point associated with the touch gesture, wherein
            when the touch panel of the touch control module detects a single-point drag having a single touch point and a set of continuous coordinates, the set of continuous coordinates of the single-point drag has multiple continuous vertical coordinates and multiple continuous horizontal coordinates of the single touch point; and
            when the touch panel of the touch control module detects a multi-point drag having two touch points moving oppositely and two sets of continuous coordinates, each set of continuous coordinates has multiple continuous vertical coordinates and multiple continuous horizontal coordinates associated with one of the touch points of the multi-point drag having two touch points moving oppositely; and
         a touch controller connected to the touch panel, and outputting at least one set of continuous coordinates corresponding to the at least one moving trajectory of touch point generated by the touch gesture;

a CPU connected to the touch controller, after receiving the at least one set of continuous coordinates from the touch controller, determining the touch gesture according to a variation of the at least one set of continuous coordinates, generating the set of waveform processing parameters based on the determined touch gesture, setting up the vertical position value according to a variation of the continuous vertical coordinates of a corresponding set of continuous coordinates, setting up the trigger position value according to a variation of the continuous horizontal coordinates of the corresponding set of continuous coordinates, having an activation threshold built therein, multiple zoom levels corresponding to different levels of the gain value and multiple frequency levels corresponding to different levels of the sampling rate, decreasing or increasing the gain value to map to a corresponding vertical scale when the two sets of continuous vertical coordinates of the two touch points of the multi-point drag having two touch points moving oppositely approach or depart from each other vertically and a sum of two respective vertical displacements of the touch points is greater than the activation threshold, and decreasing or increasing the sampling rate to map to a corresponding horizontal scale when the two sets of continuous horizontal coordinates of the two touch points of the multi-point drag having two touch points moving oppositely approach or depart from each other horizontally and a sum of two respective horizontal displacements of the two touch points is greater than the activation threshold; and a display module; and a waveform processing and sampling unit connected to the touch control module and the display module of the touch screen display unit, having:

at least one signal input port to respectively receive at least one external signal to be tested, selectively processing one of the at least one external signal to be tested to a corresponding waveform image according to the set of waveform processing parameters, and outputting the waveform image to the display module to further display the waveform image on the display module, and a vertical position adjustment module, an amplitude gain control module, an analog-to-digital (A/D) conversion module and a digital signal processing module, wherein the vertical position adjustment module is connected to the at least one signal input port.

2. The oscilloscope with touch control as claimed in claim 1, wherein the vertical position adjustment module has two digital-to-analog (D/A) converters and two voltage adders, the two D/A converters are respectively connected to the voltage adders and are connected to the CPU of the touch control module, the CPU outputs the vertical position value to each of the two D/A converters, after receiving the vertical position value, and each D/A converter outputs a corresponding DC voltage to one of the voltage adders, each voltage adder is connected to one of the at least one signal input port to add the DC voltage outputted from a corresponding D/A converter to a corresponding signal to be tested.

3. The oscilloscope with touch control as claimed in claim 2, wherein the amplitude gain control module has two amplifiers, the two amplifiers are connected to the respective voltage adders to receive the signals to be tested outputted from the corresponding voltage adders, and each amplifier has a gain control terminal connected to the CPU of the touch control module for the amplifier to amplify the signal to be tested according to the zoom level mapped to by the corresponding gain value.

4. The oscilloscope with touch control as claimed in claim 3, wherein the A/D conversion module has two A/D converters respectively connected to the two amplifiers of the amplitude gain control module so as to receive the signals to be tested through the signal addition and amplification and to acquire digital data through the sampling and quantization of the signals to be tested; and the digital signal processing module has:

a clock generator connected to the two A/D converters of the A/D conversion module, the sampling control circuit and the CPU of the touch control module, and outputting a clock signal with a frequency corresponding to the frequency level set up by the CPU to the two A/D converters and the sampling control circuit;

an acquisition memory;

a sampling control circuit connected to the acquisition memory, the trigger control circuit and the display module, and storing the digital data quantized by and outputted from the two A/D converters according to the clock signal outputted by the clock generator in the acquisition memory; and a trigger control circuit outputting a trigger signal to the sampling control circuit so that the sampling control circuit stops sampling after receiving the trigger signal and counting a wait time, reads the digital data with a fixed memory length, takes the digital data as waveform data, and outputs the waveform data to the display module for the display module to display a corresponding waveform.

5. The oscilloscope with touch control as claimed in claim 4, wherein the sampling control circuit sets up a pre-trigger count (Tpre) and a post-trigger count (Tpost), the Tpre and Tpost are calculated with a horizontal position h' set up by the CPU of the touch control module according to the following equations:

$$Tpre=(H \times N/2 - h'), h'=h+\Delta h, \Delta h=(\Delta d \times N \times H)/I$$

$$Tpost=(H \times N/2 + h'), h'=h+\Delta h, \Delta h=(\Delta d \times N \times H)/I$$

where N is a number of horizontal divisions displayed on the display module along the horizontal (time) axis, H is a horizontal length (time) per division (unit: s/div), h is a previous coordinate of a trigger point on the horizontal (time) axis (unit: s), $\Delta h$ is a distance (time) of the trigger point moving along the horizontal (time) axis in current operation (unit: s), $\Delta d$ is a pixel count of the single touch point moving horizontally in current operation, and I is a total pixel count of the display module in the horizontal direction; and after counting the Tpre, the sampling control circuit starts to receive the trigger signal outputted from the trigger control circuit, waits for a time specified by the Tpost after receiving the trigger signal, and then stops sampling, reads the digital data with the fixed memory length from the acquisition memory, processes the digital data to a waveform image, and outputs the waveform image to the display module.

6. The oscilloscope with touch control as claimed in claim 5, wherein when receiving the set of continuous coordinates of the single touch points of the single-point drag, the CPU determines if a slanted angle between a moving direction of the single touch point and the horizontal axis falls within a range of 30° to 60°, if negative, neglects the continuous vertical coordinates or the continuous horizontal coordinates with smaller changes, if positive, varies the vertical position value according to a variation of the continuous vertical coordinates and varies the trigger position value according to a variation of the continuous horizontal coordinates.

7. The oscilloscope with touch control as claimed in claim 6, wherein when the touch panel detects a multi-point drag with two touch points moving oppositely and the CPU receives the two sets of continuous coordinates of the two touch points, the CPU determines if a slanted angle between a direction of the two touch points approaching or departing from each other and the horizontal axis falls within a range of 30° to 60° (or 120° to 150°), if negative, neglects the coordinates with smaller changes approaching or departing from each other along one of the horizontal and vertical directions, if positive, varies the gain value according to a variation of the continuous vertical coordinates of the two touch points approaching or departing from each other and varies the sampling rates according to a variation of the continuous horizontal coordinates approaching or departing from each other.

8. The oscilloscope with touch control as claimed in claim 7, wherein when the touch panel detects a multi-point drag with multiple touch points dragged uni-directionally, if the CPU determines that the touch points are dragged together along the vertical axis, the CPU multiplies the vertical position value by a magnification factor according to a number of the touch points, and if the CPU determines that the touch points are dragged together along the horizontal axis, the CPU multiplies the trigger position value by a magnification factor according to the number of the touch points.

9. The oscilloscope with touch control as claimed in claim 8, wherein the CPU is connected to the display module, sets up a vertical operation zone for slow movement and a horizontal operation zone for slow movement on the display module, multiplies the vertical position value by a minification factor when determining that the moving trajectory of the single touch point of a single-point drag is located on the vertical operation zone for slow movement, and multiplies the trigger position value by a minification factor when determining that the moving trajectory of the single touch point of the single-point drag is located on the horizontal operation zone for slow movement.

10. The oscilloscope with touch control as claimed in claim 9, wherein
when the touch screen display unit detects the single-point fast drag and throw, the set of continuous coordinates of the moving trajectory of the single-point drag gradually increase, and a distance between final two coordinates is the largest; and
the CPU has a preset deceleration value, defines the distance between the final two coordinates as a largest movement value when determining that the distance of adjacent two of the set of continuous coordinates progressively increases, constantly varies the trigger position value using the largest movement value, progressively decreases the largest movement value with the deceleration value, and stops varying the trigger position value when the largest movement value is reduced to zero.

11. A touch control operating method of displaying waveform of an oscilloscope with touch control, wherein the oscilloscope has a touch screen display unit for detecting a touch gesture, a pre-trigger count (Tpre) and a post-trigger count (Tpost), wherein the touch gesture is defined by a single-point drag gesture with a single touch point and a multi-point drag gesture with two touch points moving oppositely, and displaying a waveform image, the method is performed after the oscilloscope receives a signal to be tested and has steps of:
receiving a set of waveform processing parameters from the touch screen display unit, wherein the set of waveform processing parameters is generated by the touch screen display unit according to a variation of the detected touch gesture, wherein the set of waveform processing parameters has a vertical position value, a gain value, a sampling rate and a trigger position value;
if detecting the single-point drag, setting up the vertical position value according to a variation of multiple continuous vertical coordinates of the single touch point of the single-point drag and setting up the trigger position value according to a variation of multiple continuous horizontal coordinates of the single touch point of the single-point drag; and
if detecting the multi-point drag, decreasing or increasing the gain value according to a variation of multiple continuous vertical coordinates of the two touch points approaching or departing from each other and decreasing or increasing the sampling rate according to a variation of multiple continuous horizontal coordinates of the two touch points approaching or departing from each other;
adding a DC voltage to the signal to be tested according to the vertical position value;
amplifying the signal to be tested according to the gain value;
sampling the signal to be tested according to the sampling rate, digitizing the sampled signal to be tested to digital data, and storing the digital data
setting up the Tpre and Tpost with a horizontal position h' according to the following equations:

$$Tpre=(H \times N/2-h'), h'=h+\Delta h, \Delta h=(\Delta d \times N \times H)/I$$

$$Tpost=(H \times N/2+h'), h'=h+\Delta h, \Delta h=(\Delta d \times N \times H)/I$$

where N is a number of horizontal divisions displayed on the oscilloscope, H is a horizontal length per division, h is a previous coordinate of a trigger point in a horizontal direction, $\Delta h$ is a distance of the trigger point moving along the horizontal direction in current operation, $\Delta d$ is a pixel count of the single touch point moving horizontally in current operation and I is a total pixel count of the oscilloscope in the horizontal direction; and
after counting the Tpre, receiving a trigger signal, waiting for a time specified by the Tpost after receiving the trigger signal, and then stopping sampling, reading the digital data with a fixed memory length, processing the digital data to a corresponding waveform image, and outputting the waveform image and displaying the waveform image on the touch screen display unit.

* * * * *

UNITED STATES PATENT AND TRADEMARK OFFICE
CERTIFICATE OF CORRECTION

PATENT NO. : 8,928,615 B2
APPLICATION NO. : 13/671702
DATED : January 6, 2015
INVENTOR(S) : Ching-Kai Meng and Yuan-Long Huang It is certified that error appears in the above-identified patent and that said Letters Patent is hereby corrected as shown below:

Title Page:

Item 72 replace the name of the first inventor "Chiang-Kai MENG" with "Ching-Kai MENG".

Signed and Sealed this
Twenty-eighth Day of June, 2016

Michelle K. Lee
*Director of the United States Patent and Trademark Office*